United States Patent
Klein et al.

(10) Patent No.: US 12,339,328 B2
(45) Date of Patent: Jun. 24, 2025

(54) METHOD FOR PREDICTING A REMAINING FAILURE OR LIFETIME OF AN ELECTRICAL COMPONENT OF AN ELECTRICAL CIRCUIT

(71) Applicant: Tridonic GmbH & Co KG, Dornbirn (AT)

(72) Inventors: Tobias Klein, Dornbirn (AT); Thomas Zengerle, Dornbirn (AT); Andreas Schmölzer, Dornbirn (AT); Markus Mayrhofer, Dornbirn (AT); Luis Javier Carracedo Cordovilla, Dornbirn (AT); Ulrich Hüttinger, Dornbirn (AT)

(73) Assignee: Tridonic GmbH & Co KG, Dornbirn (AT)

( * ) Notice: Subject to any disclaimer, the term of this patent is extended or adjusted under 35 U.S.C. 154(b) by 49 days.

(21) Appl. No.: 18/549,401

(22) PCT Filed: Mar. 11, 2022

(86) PCT No.: PCT/EP2022/056300
§ 371 (c)(1),
(2) Date: Sep. 7, 2023

(87) PCT Pub. No.: WO2022/189613
PCT Pub. Date: Sep. 15, 2022

(65) Prior Publication Data
US 2024/0159844 A1    May 16, 2024

(30) Foreign Application Priority Data

Mar. 11, 2021    (EP) .................................... 21161923

(51) Int. Cl.
*G01R 31/12*      (2020.01)
*G01R 31/28*      (2006.01)
*G01R 31/64*      (2020.01)

(52) U.S. Cl.
CPC .......... *G01R 31/64* (2020.01); *G01R 31/282* (2013.01); *G01R 31/2846* (2013.01); *G01R 31/2849* (2013.01)

(58) Field of Classification Search
CPC .. G01R 31/64; G01R 31/2846; G01R 31/282; G01R 31/2849; G01R 31/2874; G05B 23/0254; G05B 23/0283
See application file for complete search history.

(56) References Cited

U.S. PATENT DOCUMENTS 10,818,370 B1 * 10/2020 Wang ................... G11C 29/021
11,018,573 B2 *  5/2021 Cianfrocco ......... H02M 1/4258
(Continued)

FOREIGN PATENT DOCUMENTS

EP    3109648 A1    12/2016
EP    3745145 A1    12/2020

OTHER PUBLICATIONS

PCT/EP2022/056300, International Search Report and Written Opinion dated Jun. 21, 2022, 15 pages.
(Continued)

*Primary Examiner* — Thang X Le
(74) *Attorney, Agent, or Firm* — Andrus Intellectual Property Law, LLP

(57) ABSTRACT

The present invention provides a method for predicting a remaining lifetime of an electrical component of an electrical circuit, the electrical circuit being part of a building management device. The method comprises: estimating (S1) two or more estimated temperatures of the electrical component by using a trained machine learning model of the electrical component that is trained based on training data. Further, the method comprises: generating (S2) a temporal course of temperature of the electrical component based on the two or more estimated temperatures; and computing (S3), based on the temporal course of temperature of the (Continued)

electrical component, an indicator for the remaining lifetime of the electrical component. The present invention also provides a method for predicting a remaining lifetime of an electrical circuit being part of a building management device.

16 Claims, 8 Drawing Sheets

(56) References Cited

U.S. PATENT DOCUMENTS

| | | | |
|---|---|---|---|
| 2018/0321090 A1* | 11/2018 | Petrzilek | H01G 9/025 |
| 2018/0373234 A1 | 12/2018 | Khalate et al. | |
| 2020/0379057 A1* | 12/2020 | El Hayek | G01R 31/64 |
| 2022/0155384 A1* | 5/2022 | Lovati | G01R 27/2605 |
| 2024/0353503 A1* | 10/2024 | Brophy | G01R 27/2605 |

OTHER PUBLICATIONS

L. Hao et al., "Prediction of Capactitor's Accelerated Aging Based on Advanced Measurements and Deep Neural Network Techniques", IEEE Transactions on Instrumentation and Measurement, vol. 69, No. 11, , pp. 9019-9022, Jun. 10, 2020.

* cited by examiner

METHOD FOR PREDICTING A REMAINING FAILURE OR LIFETIME OF AN ELECTRICAL COMPONENT OF AN ELECTRICAL CIRCUIT

CROSS REFERENCE TO RELATED APPLICATIONS

The present application is the U.S. national stage application of international application PCT/EP2022/056300 filed Mar. 11, 2022, which international application was published on Sep. 15, 2022 as International Publication WO 2022/189613 A1. The international application claims priority to European Patent Application No. 21161923.4 filed Mar. 11, 2021.

BACKGROUND AND SUMMARY OF THE INVENTION

The present invention relates to a method for predicting a remaining lifetime of an electrical component of a building management device, a module thereof or an electrical circuit, the electrical circuit being part of the building management device. The present invention further relates to a method for predicting a failure or a remaining lifetime of an electrical circuit, the electrical circuit being part of a building management device. Furthermore, the present invention relates to a control unit for a building management device and to a building management device.

The present disclosure is in the field of predicting the failure or remaining lifetime of a building management device, a module thereof or electrical components of an electrical circuit. There is a relationship between the lifetime of an electrical component and the temperature experienced by the electrical component over time. The higher the temperature that is experienced by the electrical component at a time the higher the stress on the electrical component at that time. Increasing the stress on the electrical component decreases the lifetime of the electrical component and, thus, decreases the remaining lifetime of the electrical component. It is to be noted that the following explanations or made for an electrical component but it is evident that the same technical relations are true for the electrical circuit, module and device which includes the component.

Therefore, during an operation of the electrical circuit comprising the electrical component, the temperature of the electrical component may be measured over time as an indicator for the stress experienced by the electrical component for predicting the remaining lifetime of the electrical component, or, to be more general an approaching future failure. This may be difficult to implement, in particular in case a prediction of the remaining lifetime of a plurality of electrical components of the electrical circuit is desired. The components for measuring the temperature of the electrical components add costs and increase the space required by the electrical circuit.

Therefore, it is an object of the present invention to provide an improved method for predicting a future failure, in particular a remaining lifetime of a building management device, a module thereof or an electrical component of an electrical circuit that overcomes the above-mentioned drawbacks and disadvantages and allows to make such predictions on parameters which are known in the device anyway. It is in particular an object of the present invention to provide such a method without the need of actually measuring the temperature of the electrical component, for which the remaining lifetime is to be predicted.

These and other objects, which become apparent upon reading the following description, are solved by the subject-matter of the independent claims. The dependent claims refer to preferred embodiments of the invention.

The following explanations are made mainly for a single electrical component. The prediction made for the component are, of course, also valid for the circuit, module of even the entire device, because the electrical component, which fails will necessarily lead to failure of the higher order entities. Reference is made to the higher order entities only in case where it is assumed to be necessary for the understanding of the invention.

According to a first aspect of the present invention, a method for predicting a future failure or more preferred a remaining lifetime of an electrical component of an electrical circuit is provided, the electrical circuit being part of a building management device. The method comprises observing or estimating at least one characteristic parameter of the building management device, module or the electrical component. Once at least one characteristic parameter has been observed or is estimated, a temporal course of the characteristic parameter is generated based thereon. From the temporal course, an indicator for the failure or the remaining lifetime of the building management device, the module or the electrical component is computed. It is more preferred that the remaining lifetime of the respective entity or component is calculated. However, in many situations it might be sufficient that only a future failure which is approaching is indicated. Instead of precisely predicting the remaining lifetime, it might be sufficient to identify whether a future failure can already be recognised to occur soon. In many cases, the one or more characteristic parameter(s) may be (a) parameter(s), which can be directly observed in the device. Such parameters may be read out by a bus system, which is present already in many of building management devices. An example for such a bus system might be a DALI system. However, some of the characteristic parameters which are crucial for the lifetime of an electrical component can only be observed when additional measuring units or sensors are provided. As an example, the temperature had been mentioned above. In such a situation, it is desired to estimate the characteristic parameter and, instead of using a directly measured parameter or a plurality of measured parameters, the estimated characteristic parameter(s) can be used in order to compute the indicator for approaching failure or the remaining lifetime.

In case that the characteristic parameter is a temperature and needs to be estimated because it cannot be directly measured, the method comprises: estimating two or more estimated temperatures of the electrical component by using a trained machine learning model of the electrical component. The trained machine learning model of the electrical component is trained based on training data comprising a plurality of data sets. Each data set of the plurality of data sets comprises: a real temperature of the electrical component at a respective time of an operation of the electrical circuit, in association with a plurality of parameters of the electrical circuit at the respective time. The plurality of parameters comprises one or more physical parameters of the electrical circuit and/or one or more operation parameters of the electrical circuit. The method comprises: estimating each estimated temperature of the two or more estimated temperatures at a respective time by inputting the plurality of parameters for the respective time to the trained machine learning model that computes the estimated temperature of the electrical component at the respective time based on the plurality of parameters for the respective time.

The method further comprises: generating the temporal course of temperature of the electrical component based on the two or more estimated temperatures; and computing, based on the temporal course of temperature of the electrical component, the indicator for the remaining lifetime of the electrical component.

With other words, the present invention according to this aspect proposes to estimate, for two or more times, the temperature of the electrical component (for which the remaining lifetime is to be predicted) using the trained machine learning model, instead of actually measuring the temperature at the two or more times. Based on the two or more estimated temperatures (estimated at the two or more times), the temporal course of temperature of the electrical component may be generated, based on which the indicator for the remaining lifetime of the electrical component may be computed. Therefore, according to the first aspect of the invention, for the prediction of the remaining lifetime of the electrical component no actual measurement of the temperature of the electrical component is required. Thus, the method according to the first aspect of the present invention overcomes the drawbacks and disadvantages of actually measuring the temperature of the electrical component, described above.

The electrical component may be a critical component of the electrical circuit. For example, the electrical component may be a capacitor, in particular an electrolytic capacitor. In case such a critical component fails, the whole electrical circuit may fail.

A building management device is an electrical device for managing the environment of a building, e.g. managing temperature, lighting, ventilation, safety, cleanliness etc. of parts of the building and/or the whole building. A building management device may be a stationary or a movable device. A plurality of building management devices may form a building management system, wherein the system may be arranged across a whole building or only a part of the building, such as a floor or one or more rooms of the building. A building management device may be configured to communicate, wirelessly and/or wire-bound, with extern (e.g. with one or more other building management devices).

A building management device may comprise or correspond to a lighting device, such as a luminaire, a lighting means driver (optionally a LED driver) or a lighting means module (optionally LED module); a dimming device for a window, such as an electrical blind; a sensor device, such as movement and/or presence detector (e.g. security camera), a smoke detector, a light sensor, a humidity sensor, a temperature sensor, an audio sensor (e.g. microphone) etc.; a security actor, such as a sprinkler, an alarm device, a door locking device, window locking device, a roll shutter etc.; an information device, such as an information screen, a security screen, a loudspeaker etc.; an actor, such as a door opener, window opener etc.; a heating, venting and/or cooling device, such as an air conditioner, fresh air ventilator, fan, heater etc.; a humidifier device; a cleaning device, such as a cleaning robot, a window cleaner; a central control unit for controlling one or more building management devices; a user interface for controlling one or more building management devices, such as a switch (e.g. light switch), a touch panel, input device etc.; and any combination of the aforementioned devices. In addition or alternatively, the building management device may comprise or correspond to any other building management device known in the art. The abbreviation "LED" stands for light emitting diode. A lighting device may be a device comprising lighting means for illumination (e.g. a luminaire or a lighting means module) or a device for operating lighting means (e.g. a lighting means driver). The lighting means may be comprise or correspond to one or more LEDs.

The electrical circuit may be a circuit for providing electrical energy to a load. In particular, the electrical circuit may be configured to provide an output voltage and an output current. For example, in case the building management device is a lighting device, the electrical circuit may be configured to provide electrical energy, in particular an output voltage and an output current, to lighting means, which may be LEDs.

A temperature of the electrical component may correspond to the case temperature of the electrical component. Thus, an estimated temperature of the electrical component may correspond to an estimated case temperature of the electrical component.

A machine learning model of the electrical component is to be understood as a model that is based on machine learning using training data for generating the model. The model may comprise or correspond to at least one algorithm that differently weights different input data, wherein the weighting is trained respectively set by machine learning based on training data of the input data. Since the input data are parameters of the electrical circuit and, thus, the training data comprise the parameters of the electrical circuit, the model defines the electrical component in the context of the electrical circuit, in which the electrical component is arranged.

The machine learning model may be trained based on the training data during a phase that may be called training phase. Once the machine learning model is trained, the trained machine learning model may be used during a phase that may be referred to as the operation or computation phase. Optionally, during the computation phase the machine learning model may be improved by training the already trained machine learning model with new data sets of the training data. That is, optionally the computation phase may be interrupted by a training phase in order to improve the already trained machine learning model of the electrical component.

The training data may be provided by a manufacturer of the electrical circuit and/or a manufacturer of the building management device. In addition or alternatively, the training data may be generated by performing measurements on the electrical circuit, in particular by measuring a plurality of parameters (which characterize the operation of the electrical circuit) and the temperature that develops at the electrical component due to the plurality of parameters. At least a part of the plurality of parameters may be obtained without measurement, e.g. received from a control unit controlling the operation of the electrical circuit.

Any data set of the training data may be generated by measuring at a respective time of an operation of the electrical circuit the real temperature of the electrical component and associating the measured real temperature with the plurality of parameters of the electrical circuit at the respective time. The terms "real" and "actual" may be used as synonyms. The passage "a plurality of parameters" is to be understood as "two or more parameters". According to an alternative, the plurality of parameters may comprise or correspond to two or more physical parameters of the electrical circuit. According to a further alternative, the plurality of parameters may comprise or correspond to two or more operation parameters of the electrical circuit. According to a further alternative, the plurality of parameters may comprise or correspond to one or more physical parameters of the electrical circuit and to one or more operation parameters of the electrical circuit.

With regard to any data set, at least a part of the plurality of parameters at the respective time may be received and the other part of the plurality of parameters at the respective time may be measured at the respective time. According to an embodiment, at least a part of the plurality of parameters at the respective time is provided by a control unit controlling the operation of the electrical circuit and the other part of the plurality of parameters at the respective time is measured at the respective time. Alternatively, the plurality of parameters at the respective time may be received or may be measured at the respective time. The plurality of parameters of the electrical circuit may be received via at least one communication interface of the electrical circuit and/or at least one communication interface of the building management device.

The one or more physical parameters of the electrical circuit may correspond or comprise at least one temperature of the electrical circuit, such as a temperature of the substrate (e.g. printed circuit board) on which the electrical circuit is arranged or a temperature inside a housing of the building management device. Such a temperature may be known, measured already by a control unit configured to control the electrical circuit, or may be more easily measured by a measuring unit compared to measuring the temperature of the electrical component. In addition or alternatively, the one or more physical parameters of the electrical circuit may correspond or comprise at least one electrical parameter of the electrical circuit, such as a supply voltage, a supply current, frequency of the supply current and/or the supply voltage, an output voltage, an output current, a power loss or an energy conversion efficiency of the electrical circuit. Such an electrical parameter may be known, measured already, e.g., by a control unit configured to control the electrical circuit, or may be measured by a measuring unit. In addition or alternatively, at least one of the one or more physical parameters may optionally be estimated by means known in the art.

The power loss of the electrical circuit may be computed by subtracting the output power (electrical output power) of the electrical circuit from the input power (electrical input power) of the electrical circuit. The energy conversion efficiency of the electrical circuit may be computed by dividing the output power of the electrical circuit by the input power of the electrical circuit.

The one or more operation parameters of the electrical circuit may correspond or comprise one or more parameters for setting an operation state of the electrical circuit. The one or more operation parameters may correspond to control parameters for controlling operation of the electrical circuit. For example, in case the building management device is a lighting device and the electrical circuit is a circuit for electrically supplying lighting means, the one or more operation parameters may correspond to a dimming level at which the lighting means is operated. The higher the dimming level the more light is emitted by the lighting means and, thus, the more electrical energy is to be supplied by the electrical circuit to the lighting means. The diming level may be provided in the form of a percentage between 0% and 100%, wherein at 0% no light is emitted (lighting means are off) and at 100% the lighting means emit a maximum of light. The one or more operation parameters may be known (e.g. in case the method of the first aspect is performed by the control unit controlling the operation of the electrical circuit) or may be received (e.g. in case the unit performing the method of the first aspect is different to the control unit controlling the operation of the electrical circuit).

When estimating an estimated temperature of the two or more estimated temperatures of the electrical circuit at a respective time, the plurality of parameters for the respective time that are input to the trained machine learning model of the electrical component are of the same type as the plurality of parameters of each data set of the training data used to train the trained machine learning model. For example, when training the machine learning model using training data comprising the supply voltage, the supply current, the output voltage and the output current as parameters of the electrical circuit, then the parameters that are input into the trained machine learning model for estimating an estimated temperature at a respective time are the supply voltage, the supply current, the output voltage and the output current for the respective time. Each data set of the training data comprises the same type of parameters of the electrical circuit associated with the respective real temperature, wherein the data sets differ with respect to the values of the parameters. The parameters input into the trained machine learning model of the electrical component for estimating an estimated temperature of the electrical component at a respective time are of the same type as the parameters, used for training the trained machine learning model, and comprise the values for the respective time. The values of the plurality of parameters, input to the trained machine learning model, for the respective time may be different to the values of the plurality of parameters of the data sets of the training data.

The real temperatures of the data sets of the training data each may have been obtained, in particular measured, in a thermal steady state respectively thermal balanced state of the electrical circuit during an operation of the electrical circuit, in which the plurality of parameters of the electrical circuit that are associated with the respective real temperature characterize the operation of the electrical circuit. In other words, when the plurality of parameters of a data set are present in the electrical circuit, the operation of the electrical circuit characterized by the plurality of parameters of the data set causes a temperature to develop at the electrical component (i.e. the temperature of the electrical component). After a time, when thermal balancing processes are completed, the temperature of the electrical component will settle in a thermal steady state of the electrical circuit during the aforementioned operation of the electrical circuit. Therefore, the respective time of a real temperature and the associated plurality of parameters of each data set of the training data may correspond to a time during the operation of the electrical circuit characterized by the plurality of parameters (associated with the real temperature), at which time the electrical circuit is in a thermal steady state respectively thermal balanced state.

The indicator for the remaining lifetime may comprise or correspond to a value that equals to a number of time units, e.g. hours, representing the remaining lifetime of the electrical component during which the component may be operated without failing. Alternatively or additionally, the indicator for the remaining lifetime may comprise or correspond to a value that equals to a percentage of the remaining lifetime with respect to the lifetime of the electrical component. The lifetime of the electrical component may be provided by the manufacturer of the electrical component or may be computed by a mathematical formula provided by the manufacturer. The values input in such a mathematical formula for computing the lifetime are constants and, thus, may correspond to average values that are typical for an assumed operation of the electrical circuit over time.

The passage "indicator of the remaining lifetime" may be used as a synonym for the passage "indicator for the remaining lifetime".

The machine learning model may correspond to a regression model, or a neural network model. Optionally, the machine learning model is a deep neural network model.

A regression model is based on a regression analysis using at least one regression algorithm. A (deep) neural network model is based on a (deep) neural network. Other machine learning implementations known in the art may be used as well for implementing the model.

In particular, the machine learning model comprises or corresponds to at least one algorithm differently weighting the plurality of parameters to compute, as an output, the estimated temperature of the electrical component at the respective time, wherein the weighting is determined by the training of the machine learning model based on the training data.

The at least one algorithm may differently weight the plurality of parameters by using a plurality of weighting factors, wherein each parameter of the plurality of physical parameters is multiplied by a respective weighting factor of the plurality of weighting factors. The plurality of weighting factors may be determined respectively adjusted by the training of the machine learning model based on the training data.

Alternatively, the at least one algorithm may differently weight the plurality of parameters by using a plurality of weighting functions, wherein the plurality of weighting functions may be determined respectively adjusted by the training of the machine learning model based on the training data.

Computing the indicator for the remaining lifetime of the electrical component may comprise integrating the temporal course of temperature of the electrical component.

The more temperature the electrical component experiences at a time the more stress it experiences, which has a negative effect on the lifetime and, thus, remaining lifetime of the electrical component. Integrating the temporal course of temperature of the electrical component over the time period, for which the temporal course of temperature is known, allows to add-up the temperatures experienced by the electrical component over the time period. The sum of all that temperatures corresponds respectively is an indicator for the total amount of stress experienced by the electrical component over the time period, for which the temporal course of temperature is known. The higher the total amount of the stress experienced by the electrical component the lower the remaining lifetime, because stress on an electrical component reduces the lifetime of the electrical component.

The indicator for the remaining lifetime of the electrical component may correspond to the integral of the temporal course of temperature of the electrical component.

Optionally, computing the indicator for the remaining lifetime of the electrical component may comprise integrating a mathematical formula for computing the lifetime of the electrical component over time, wherein the mathematical formula comprises the temperature of the electrical component as an input variable and the temporal course of the temperature is input for that input variable. The integral may be computed over the time period for which the temporal course of the temperature is generated. In particular, computing the indicator for the remaining lifetime of the electrical component may comprise integrating the reciprocal (multiplicative inverse) of the mathematical formula for computing the lifetime of the electrical component over time. For computing the indicator for the remaining lifetime, the computed integral may be subtracted from one (100%). In this case, the indicator for the remaining lifetime may correspond to a percentage value of the lifetime of the electrical component.

Optionally, computing the indicator for the remaining lifetime of the electrical component further comprises weighting the integrated temporal course of temperature of the electrical component with a weighting function or weighting factor, wherein the weighting function or the weighting factor is dependent on at least one parameter of the plurality of parameters.

This allows considering cases, in which one of the plurality of parameters of the electrical circuit negatively influences (effects) the remaining lifetime of the electrical component to an extent that is greater to an extent by which the temperature of the electrical circuit is influenced. For example, in case of unwanted short voltage peaks of the input voltage (being an example of a parameter of the plurality of parameters) of the electrical circuit, such peaks may have a negative influence on the remaining lifetime of the electrical component. However, since the voltage peaks are only short they may not effect to the same extent the temperature of the electrical circuit and, thus, may not be considered with a sufficient weighting by the machine learning model of the electrical component.

The indicator for the remaining lifetime of the electrical component may correspond to the integral of the temporal course of the estimated temperature of the electrical component that is weighted with a weighting function or weighting factor.

Optionally, computing the indicator for the remaining lifetime of the electrical component comprises weighting the integrated mathematical formula for computing the lifetime of the electrical component over time with a weighting function or weighting factor, wherein the weighting function or the weighting factor is dependent on at least one parameter of the plurality of parameters. Computing the indicator for the remaining lifetime of the electrical component may comprise weighting the integrated reciprocal (multiplicative inverse) of the mathematical formula for computing the lifetime of the electrical component over time with a weighting function or weighting factor, wherein the weighting function or the weighting factor is dependent on at least one parameter of the plurality of parameters.

In particular, the weighting function or weighting factor may be determined such that for different ranges of the at least one parameter of the plurality of parameters, the weighting function corresponds to respective weighting functions or the weighting factor corresponds to respective weighting factors.

For example, the weighting factor may correspond to a first weighting factor in case the at least one parameter is smaller than a threshold and to a second weighting factor in case the at least one parameter is equal to or greater than the threshold. This is correspondingly valid for more than one threshold and, thus for more than two ranges of the at least one parameter. This is correspondingly valid in case of a weighting function.

Contrary, to the situation where the behaviour of an electrical component must be modelled in order to estimate the characteristic parameter because there is no possibility to directly measure the parameter, it is also possible very often, to measure the characteristic parameter or even a plurality of characteristic parameters directly during operation of the device including its modules and electrical components.

Such parameters may then be read out by a bus system in a well known manner, for example using DALI. In such a situation, computing the indicator for the failure or the remaining lifetime comprises determining a degree of similarity between the temporal course of the characteristic parameter(s) with a pattern of the respective characteristic parameter(s) retrieved from a memory, wherein the pattern is stored associated with a failure to be expected and the characteristic parameter(s) is/are observed parameter(s). The pattern is determined in advance. In order to determine such a pattern, the device including the module, electric circuit and electrical component of interest is tested and parameters which shall later be used in order to predict failure or the remaining lifetime are measured. For determination of the pattern(s), the measured parameters are logged until a failure can be determined. Such a failure may either be provoked by manipulating components of the device or may occur accidentally, for example in a lifetime simulation. Such a lifetime simulation corresponds to the stress for the device over an expected overall lifetime but allows us to observe and log the parameters only over a shortened period of time during which switching cycles, environment temperature, and so on corresponding to the overall lifetime are applied to the device under test. Alternatively, the patterns may identified from feedback of customers and an analysis of the failure which occurred.

From the logged measured values (parameters) a pattern of these parameters preceding failure of the device, a single module of the device, an electrical circuit or even a single electrical component is determined. In the simplest configuration, the pattern may comprise only one prototypical course over time for a single parameter. However, such a pattern may also comprise causes over time for a plurality of parameters.

The patterns that can be identified to precede failure of a component or device are then stored associated with the respective identified failure indicating the module, electrical circuit or component. The pattern is then stored in association with the failure to be expected and, preferably, with a time that can be observed between the pattern and the failure. In case that such a time relationship can be observed and stored with the pattern, it is possible to predict not only an approaching failure but even the remaining lifetime corresponding to the time until failure. Once the pattern is determined it stored in a memory of new devices so that it can be retrieved during operation of the device. Thus, during operation of the device it is possible to compare the temporal course of a characteristic parameter or a plurality of characteristic parameters with at least one stored patterns. Of course, it is also possible to store a plurality of patterns so that the temporal because of the one or more characteristic parameters can be compared to all of the available patterns.

Advantageously, the temporal course of the characteristic parameter(s) is determined to correspond to a specific pattern, if the degree of similarity exceeds a predefined threshold.

The plurality of parameters may comprise at least two of:
a temperature of a control unit for controlling the electrical circuit;
a temperature of a substrate, optionally printed circuit board, at which the electrical circuit is arranged;
a temperature inside a housing of the building management device;
a supply voltage received by the electrical circuit from an electrical energy source;
a supply current received by the electrical circuit from the electrical energy source;
frequency of the supply voltage and/or current received by the electrical circuit from the electrical energy source,
an output voltage output by the electrical circuit;
an output current output by the electrical circuit;
a power loss of the electrical circuit;
an energy conversion efficiency of the electrical circuit;
a value for setting an operation state of the building management device, and
in case the building management device is a lighting device, a dimming level at which the electrical circuit is operated for electrically supplying lighting means.

In case the electrical circuit is configured to supply a load (e.g. lighting means in case the building management device is a lighting device) with electrical energy, the output voltage may be a load voltage provided by the electrical circuit to the load. Correspondingly, the output current may be a load current provided by the electrical circuit to the load. The supply voltage may be referred to as the input voltage of the electrical circuit. The supply current may be referred to as the input current of the electrical circuit.

In particular, for generating the temporal course of temperature of the electrical component, the method comprises: reading the two or more estimated temperatures from a data storage that stores the two or more estimated temperatures. In addition or alternatively, the method may comprise computing the two or more estimated temperatures in real-time.

That is, when generating for a certain time the temporal course of temperature of the electrical component, the method may use stored estimated temperatures and, thus, may generate at the certain time the temporal course of the temperature for the past. The closer the certain time is to the times at which the stored estimated temperatures have been estimated, the more relevant may be the generated temporal course of temperature (generated based on that stored estimated temperatures) for computing the indicator for the remaining lifetime at the certain time, and, thus for predicting the remaining lifetime of the electrical component at the certain time. In addition or alternatively, the estimated temperatures may be computed in real-time using the trained machine learning model of the electrical component. This allows constantly updating the temporal course of temperature of the electrical component in real-time and, thus, improves the accuracy of computing the indicator for the remaining lifetime at a current time.

In particular, for generating the temporal course of temperature of the electrical component, the method may comprise: reading at least one estimated temperature of the two or more estimated temperatures from the data storage that stores the at least one estimated temperature, and computing the at least one other estimated temperature of the two or more estimated temperatures in real-time.

The electrical component may be a capacitor, optionally an electrolytic capacitor, and the method may comprise: obtaining one or more voltage ripple values of a voltage of the electrical component by obtaining for one or more time periods a respective voltage ripple value of the voltage of the electrical component; and computing, based on the one or more voltage ripple values, a further indicator for the remaining lifetime of the electrical component.

That is, in case the electrical component is a capacitor the method may comprise computing, based on one or more voltage ripple values of the voltage of the electrical component (capacitor), a further indicator for the remaining lifetime of the electrical component. Therefore, in addition to the indicator for the remaining lifetime of the electrical component (computed based on the temporal course of temperature of the electrical component) a further indicator for the remaining lifetime of the electrical component may be computed, in case the electrical component is a capacitor. The further indicator for the remaining lifetime of the electrical component may be determined based on one or more voltage ripple values of the voltage of the electrical component. The voltage of the electrical component being a capacitor may be referred to as the voltage across the capacitor.

The one or more voltage ripple values may be obtained by measuring the voltage of the electrical component. In particular, each voltage rippled value of the one or more voltage ripple values may be obtained by performing, during the respective time period of the one or more time periods, multiple measurements of the voltage of the electrical component at different times. Using the multiple measurements, the voltage ripple value for the respective time period may be computed (respectively calculated) by subtracting a minimum value of the voltage of the electrical component (i e minimum value among the multiple measurements) from a maximum value of the voltage of the electrical component (i.e. maximum value among the multiple measurements). In other words, the one or more voltage ripple values may be computed by subtracting rolling minimum values of the voltage from rolling maximum values of the voltage. Measuring the voltage of the electrical component may be easier, in particular less costly and less space consuming, compared to measuring the temperature of the electrical component.

Therefore, a voltage ripple value (of the voltage of the electrical component being a capacitor) for a time period may be computed by performing multiple measurements of the voltage (of the electrical component) during the time period and, based on the multiple measurements, subtracting a minimum value of the voltage during the time period from a maximum value of the voltage during the time period.

The voltage of the electrical component may be already measured in the electrical circuit and, thus, multiple measurements of the voltage of the electrical component may be obtained without the need of adapting the electrical circuit for such voltage measurements. The one or more voltage ripple values and/or multiple measurements of the voltage of the electrical component may be provided by a control unit controlling the operation of the electrical circuit.

The further indicator for the remaining lifetime may comprise or correspond to a value that equals to a number of time units, e.g. hours, representing the remaining lifetime of the electrical component during which the component may be operated without failing. Alternatively or additionally, the indicator for the remaining lifetime may comprise or correspond to a value that equals to a percentage of the remaining lifetime with respect to the lifetime of the electrical component. The lifetime of the electrical component may be provided by the manufacturer of the electrical component or may be computed by a mathematical formula provided by the manufacturer. The values input in such a mathematical formula for computing the lifetime are constants and, thus, may correspond to average values that are typical for an assumed operation of the electrical circuit over time.

Optionally, the method comprises: computing the further indicator for the remaining lifetime of the electrical component by comparing the one or more voltage ripple values with one or more initial voltage ripple values, wherein an increase of the one or more voltage ripples values with regard to the one or more initial voltage ripple values indicates a decrease in the remaining lifetime of the electrical component.

In other words, one or more initial voltage ripple values (e.g. measured at an initial operation of the electrical circuit and/or provided by the manufacturer of the electrical component) may be compared with one or more actual voltage ripple values as time is evolving for determining the further indicator for the remaining lifetime of the electrical component.

The voltage ripple of the voltage of the capacitor (being the electrical component) is determined by the capacitance of the capacitor, wherein the voltage ripple of the voltage of the capacitor is inversely proportional to the capacitance of the capacitor. Therefore, an increase of voltage ripple of the voltage of the capacitor over time may be used as a measure respectively indicator for the capacitor's aging that is visible through a decrease of the capacitance of the capacitor.

The method may comprise: obtaining two or more voltage ripple values of the voltage of the electrical component by obtaining for two or more time periods the respective voltage ripple value of the voltage of the electrical component.

The method may comprise: generating, based on the two or more voltage ripple values, a temporal course of voltage ripple of the voltage of the electrical component, and computing, based on the temporal course of voltage ripple of the voltage of the electrical component, the further indicator for the remaining lifetime of the electrical component, wherein an increase of the temporal course of voltage ripple indicates a decrease in the remaining lifetime of the electrical component. In addition or alternatively, the method may comprise: computing, based on the two or more voltage ripple values, two or more capacitance values of the electrical component for the two or more time periods, wherein the greater the respective voltage ripple value the smaller the respective capacitance value of the electrical component; generating, based on the two or more capacitance values, a temporal course of capacitance of the electrical component; and computing, based on the temporal course of capacitance of the electrical component, the further indicator for the remaining lifetime of the electrical component, wherein a decrease of the temporal course of the capacitance indicates a decrease in the remaining lifetime of the electrical component.

That is, in case the electrical component is a capacitor, the further indicator for the remaining lifetime of the electrical component may be computed based on the temporal course of voltage ripple of the voltage of the electrical component. In addition or alternatively, the further indicator for the remaining lifetime of the electrical component may be computed based on the temporal course of capacitance of the electrical component. The temporal course of voltage ripple of the voltage of the electrical component and the temporal course of capacitance of the electrical component are inversely proportional. That is, when the voltage ripple of the voltage of the electrical component increases over time (i.e. the temporal course of voltage ripple increases), then the capacitance of the electrical component decreases over time (i.e. the temporal course of capacitance decreases) and vice versa.

An increase of the voltage ripple of the voltage of the electrical component over time indicates a decrease in the remaining lifetime of the electrical component. Thus, a decrease of the capacitance of the electrical component over time indicates a decrease in the remaining lifetime of the electrical component.

The method may comprise: monitoring the temporal course of voltage ripple of the voltage of the electrical component. The method may comprise: outputting an alarm indicating a reduced remaining lifetime of the electrical component, and/or automatically adjusting at least one setting of the building management device, in case a change of the temporal course of voltage ripple within a time period is greater than a threshold for the change. In addition or alternatively, the method may comprise: monitoring the temporal course of capacitance of the electrical component. The method may comprise: outputting an alarm indicating a reduced remaining lifetime of the electrical component, and/or automatically adjusting at least one setting of the building management device, in case a change of the temporal course of capacitance of the electrical component within a time period is greater than a threshold for the change.

For example, automatically adjusting at least one setting of the building management device may comprise or correspond to limiting the maximum allowable current and/or voltage at which the building management device and, thus, the electrical circuit is allowed to be operated. In other words, the maximum allowable current and/or voltage may be reduced (i.e. reduced below the possible maximum current respectively voltage). This reduces the stress on the electrical circuit and, thus, the stress on the electrical component for counteracting the detected reduced remaining lifetime. In this case, the limiting may be such that the operation of the building management device is still possible, optionally at a reduced functionality (e.g. reduced lighting in case of lighting device, reduce ventilation in case of ventilation device etc.). In some cases, an operation of a building management device at a reduced functionality is preferred compared to a complete failure. For example, in case of lighting, it is preferred to have a lighting at 80% compared to having no lighting. Thus, in case the building management device is a lighting device, automatically adjusting at least one setting of the building management device may comprise or correspond to limiting the maximum allowable dimming level of the lighting device to a dimming level smaller than 100%, e.g. 80%.

The alarm indicating the reduced remaining lifetime of the electrical component may inform a user or a facility management about the reduced remaining lifetime of the electrical component and, thus, the user or the facility management may take counter measures, such as replacing the electrical component, the electrical circuit or the building management device.

With regard to the temporal course of voltage ripple, the threshold for the change may indicate a maximum allowable change, in particular increase, of the voltage ripple of the voltage of the electrical component during the time period. Any change, in particular increase, of the voltage ripple during the time period that is greater than the threshold for the change may indicate a critical remaining lifetime of the electrical component. With regard to the temporal course of capacitance, the threshold for the change may indicate a maximum allowable change, in particular decrease, of the capacitance of the electrical component during the time period. Any change, in particular decrease, of the capacitance during the time period that is greater than the threshold for the change may indicate a critical remaining lifetime of the electrical component. A critical remaining lifetime of the electrical component may correspond to a percentage of the initial lifetime of the electrical component, e.g. 20% of the initial lifetime.

Optionally, the method comprises: verifying the computed indicator for the remaining lifetime of the electrical component based on the computed further indicator for the remaining lifetime of the electrical component. The method may further comprise: replacing the computed indicator for the remaining lifetime of the electrical component with the computed further indicator for the remaining lifetime of the electrical component, in case the computed further indicator for the remaining lifetime of the electrical component indicates a shorter remaining lifetime compared to the computed indicator for the remaining lifetime of the electrical component. In addition or alternatively, the method may further comprise: re-computing the indicator for the remaining lifetime of the electrical component, in case the difference between the computed indicator and the computed further indicator is greater than a threshold for the difference. In addition or alternatively, the method may further comprise: correcting the computed indicator for the remaining lifetime of the electrical component based on the computed further indicator for the remaining lifetime of the electrical component, in case the difference between the computed indicator and the computed further indicator is greater than a threshold for the difference.

Thus, the computed further indicator for the remaining lifetime of the electrical component may be used for verifying the computed indicator for the remaining lifetime of the electrical component. This may improve accuracy of predicting the remaining lifetime of the electrical component.

Optionally, the method comprises comparing the computed indicator for the remaining lifetime of the electrical component and/or the computed further indicator for the remaining lifetime of the electrical component with a threshold for the remaining lifetime of the electrical component, and in case the remaining lifetime of the indicator and/or the remaining lifetime of the further indicator is equal to or smaller than the threshold: outputting an alarm indicating a reduced remaining lifetime of the electrical component. Alternatively or additionally, in case the remaining lifetime of the indicator and/or the remaining lifetime of the further indicator is equal to or smaller than the threshold, the method may comprise: automatically adjusting at least one setting of the building management device.

In other words, in case only the indicator for the remaining lifetime of the electrical component is computed (based on the temporal course of temperature of the electrical component), the method comprises: comparing the computed indicator for the remaining lifetime of the electrical component with the threshold for the remaining lifetime of the electrical component. In case, the indicator and the further indicator are computed, the method may comprise comparing the computed indicator and the computed further indicator with the threshold for the remaining lifetime of the electrical component. In this case, outputting the alarm and/or automatically adjusting the at least one setting of the building management device may be performed, in case the remaining lifetime of the indicator or the remaining lifetime of the further indicator is equal to or smaller than the threshold. Alternatively, outputting the alarm and/or automatically adjusting the at least one setting of the building management device may be performed, in case the remaining lifetime of the indicator and the remaining lifetime of the further indicator is equal to or smaller than the threshold.

The passage "remaining lifetime of the indicator" and the passage "remaining lifetime indicated by the indicator" may be used as synonyms. The passage "remaining lifetime of the further indicator" and the passage "remaining lifetime indicated by the further indicator" may be used as synonyms.

For example, automatically adjusting at least one setting of the building management device may comprise or correspond to limiting the maximum allowable current and/or voltage at which the building management device and, thus, the electrical circuit is allowed to be operated. In other words, the maximum allowable current and/or voltage may be reduced (i.e. reduced below the possible maximum current respectively voltage). This reduces the stress on the electrical circuit and, thus, the stress on the electrical component for counteracting the detected reduced remaining lifetime. In this case, the limiting may be such that the operation of the building management device is still possible, optionally at a reduced functionality (e.g. reduced lighting in case of lighting device, reduce ventilation in case of ventilation device etc.). In some cases, an operation of a building management device at a reduced functionality is preferred compared to a complete failure. For example, in case of lighting, it is preferred to have a lighting at 80% compared to having no lighting. Thus, in case the building management device is a lighting device, automatically adjusting at least one setting of the building management may comprise or correspond to limiting the maximum allowable dimming level of the lighting device to a dimming level smaller than 100%, e.g. 80%.

The alarm indicating the reduced remaining lifetime of the electrical component may inform a user or a facility management about the reduced remaining lifetime of the electrical component and, thus, the user or the facility management may take counter measures, such as replacing the electrical component, the electrical circuit or the building management device.

Optionally, the method comprises storing the computed indicator for the remaining lifetime of the electrical component and/or the computed further indicator for the remaining lifetime of the electrical component in a data storage.

The data storage may be part of the building management device. Alternatively or additionally, the data storage may be a central data base, such as a data base of a building management system, wherein the building management device is a part of that system. Alternatively, the data storage may be part of a testing device for testing the remaining lifetime of the building management device. That is, the computed indicator for the remaining lifetime of the electrical component may be locally stored in the building management device and/or externally stored in an external data storage, such as in a central data base and/or in a testing device.

In order to achieve the method according to the first aspect of the present invention, some or all of the above described optional features may be combined with each other.

According to a second aspect of the present invention, a method for predicting a remaining lifetime of an electrical circuit is provided, the electrical circuit being part of a building management device. The method comprises selecting at least one electrical component of the electrical circuit, and performing the method according to the first aspect of the present invention, as described above, for the at least one electrical component to compute the indicator for the remaining lifetime of the at least one electrical component. The method further comprises generating an indicator for the remaining lifetime of the electrical circuit based on the computed indicator for the remaining lifetime of the at least one electrical component.

In case one electrical component of the electrical circuit is selected, the indicator for the remaining lifetime of the electrical circuit may be equal to the computed indicator for the remaining lifetime of the electrical component. In case two or more electrical components of the electrical circuit are selected, the method may comprise: performing the method according to the first aspect of the present invention, as described above, for each electrical component of the two or more electrical components to compute the respective indicator for the remaining lifetime of the electrical component; and selecting the respective indicator indicating the shortest remaining lifetime as the indicator for the remaining lifetime of the electrical circuit.

The two or more electrical components may correspond to critical components of the electrical circuit such that a failure of at least one of the two or more electrical components results in a failure of the electrical circuit.

In case one electrical component, being a capacitor, of the electrical circuit is selected, the method may comprises: generating a further indicator for the remaining lifetime of the electrical circuit by performing one or more optional features, regarding a further indicator, of the method according to the first aspect of the present invention, as described above, for the at least one electrical component. The further indicator for the remaining lifetime of the electrical circuit is equal to the computed further indicator for the remaining lifetime of the electrical component. In case two or more electrical components, being two or more capacitors, of the electrical circuit are selected, the method may comprise: generating the further indicator for the remaining lifetime of the electrical circuit by:

performing one or more optional features, regarding a further indicator, of the method according to the first aspect of the present invention, as described above, for each electrical component of the two or more electrical components to compute a respective further indicator for the remaining lifetime of the electrical component, and selecting the respective further indicator indicating the shortest remaining lifetime as the further indicator for the remaining lifetime of the electrical circuit.

Optionally the method comprises: monitoring the temporal course of voltage ripple of the voltage of the at least one electrical component. The method may comprise outputting an alarm indicating a reduced remaining lifetime of the electrical circuit, and/or automatically adjusting at least one setting of the building management device, in case a change of the temporal course of voltage ripple within a time period is greater than a threshold for the change. In addition or alternatively, the method may comprise: monitoring the temporal course of capacitance of the at least one electrical component. The method may comprise: outputting an alarm indicating a reduced remaining lifetime of the electrical circuit, and/or automatically adjusting at least one setting of the building management device, in case a change of the temporal course of capacitance of the at least one electrical component within a time period is greater than a threshold for the change.

The above description of the method according to the first aspect with regard to automatically adjusting at least one setting of the building management device and outputting the alarm indicating the reduced remaining lifetime of the electrical component is correspondingly valid for the above corresponding optional features of the method according to the second aspect.

Optionally, the method may comprise: verifying the indicator for the remaining lifetime of the electrical circuit based on the further indicator for the remaining lifetime of the electrical circuit. The method may further comprise: replacing the indicator for the remaining lifetime of the electrical circuit with the further indicator for the remaining lifetime of the electrical circuit, in case the further indicator for the remaining lifetime of the electrical circuit indicates a shorter remaining lifetime compared to the indicator for the remaining lifetime of the electrical circuit. In addition or alternatively, the method may further comprise: re-computing the indicator for the remaining lifetime of the electrical circuit, in case the difference between the indicator and the further indicator is greater than a threshold for the difference. In addition or alternatively, the method may further comprise: correcting the indicator for the remaining lifetime of the electrical circuit based on the further indicator for the remaining lifetime of electrical circuit, in case the difference between the indicator and the further indicator is greater than a threshold for the difference.

Thus, the further indicator for the remaining lifetime of the electrical circuit may be used for verifying the indicator for the remaining lifetime of the electrical circuit. This may improve accuracy of predicting the remaining lifetime of the electrical circuit.

Optionally, the method comprises: comparing the computed indicator for the remaining lifetime of the electrical circuit and/or the computed further indicator for the remaining lifetime of the electrical circuit with a threshold for the remaining lifetime of the electrical circuit, and in case the remaining lifetime of the indicator and/or the remaining lifetime of the further indicator is equal to or smaller than the threshold, outputting an alarm indicating a reduced remaining lifetime of the electrical circuit. In addition or alternatively, in case the remaining lifetime of the indicator and/or the remaining lifetime of the further indicator is equal to or smaller than the threshold, the method may comprise: automatically adjusting at least one setting of the building management device.

In other words, in case only the indicator for the remaining lifetime of the electrical circuit is computed, the method comprises: comparing the computed indicator for the remaining lifetime of the electrical circuit with the threshold for the remaining lifetime of the electrical component. In case, the indicator and the further indicator are computed, the method may comprise comparing the computed indicator and the computed further indicator with the threshold for the remaining lifetime of the electrical circuit. In this case, outputting the alarm and/or automatically adjusting the at least one setting of the building management device may be performed, in case the remaining lifetime of the indicator or the remaining lifetime of the further indicator is equal to or smaller than the threshold. Alternatively, outputting the alarm and/or automatically adjusting the at least one setting of the building management device may be performed, in case the remaining lifetime of the indicator and the remaining lifetime of the further indicator is equal to or smaller than the threshold.

The above description of the method according to the first aspect with regard to automatically adjusting at least one setting of the building management device and outputting the alarm indicating the reduced remaining lifetime of the electrical component is correspondingly valid for the above corresponding optional features of the method according to the second aspect.

The at least one electrical component of the electrical circuit may comprise or correspond to a critical component of the electrical circuit. Optionally, the critical component of the electrical circuit is an electrolytic capacitor.

In order to achieve the method according to the second aspect of the present invention, some or all of the above described optional features may be combined with each other.

The above description with regard to the method according to the first aspect of the present invention is also valid for the method of the second aspect of the present invention.

The method according to the second aspect achieves the same advantages as the method according to the first aspect.

According to a third aspect of the present invention, a control unit for a building management device is provided, the building management device comprising an electrical circuit. The control unit is configured to perform the method according to the first aspect of the present invention, as described above, to predict the remaining lifetime of an electrical component of the electrical circuit. In addition or alternatively, the control unit is configured to perform the method according to the second aspect of the present invention, as described above, to predict the remaining lifetime of the electrical circuit.

The control unit may comprise or correspond to a processor, a microprocessor, a controller, a microcontroller, an application specific integrated circuit (ASIC), a field-programmable gate array (FPGA) or any combination thereof.

The control unit may be part of the building management device. Alternatively, the control unit may be a central control unit, for example a central control unit of a system (e.g. building management system) comprising the building management device. The control unit may correspond to a processing unit for predicting a remaining lifetime of elements of a building management system, such as an electrical circuit of the building management system or at least one electrical component of the electrical circuit. Such a processing unit (control unit) may be part of a testing device for testing building management devices.

In order to achieve the control unit according to the third aspect of the present invention, some or all of the above described optional features may be combined with each other.

The above description with regard to the method according to the first aspect of the present invention and the method according to the second aspect of the present invention is also valid for the control unit of the third aspect of the present invention.

The control unit according to the third aspect achieves the same advantages as the method according to the first aspect.

According to a fourth aspect of the present invention a building management device is provided, comprising an electrical circuit, and a control unit according to the third aspect of the present invention, as described above. The control unit is configured to control the electrical circuit.

The above description with regard to the method according to the first aspect of the present invention, the method according to the second aspect of the present invention and the control unit according to the third aspect of the present invention is also valid for the building management device of the fourth aspect of the present invention.

In particular, the above description with respect to building management devices is valid for the building management device according to the fourth aspect of the present invention.

The building management device according to the fourth aspect achieves the same advantages as the method according to the first aspect.

A fifth aspect of the present invention provides a program code for performing the method according to the first aspect, as described above, and/or the method according to the second aspect, as described above.

A sixth aspect of the present invention provides a computer program comprising program code for performing when implemented on a processor, the method according to the first aspect, as described above, and/or the method according to the second aspect, as described above.

A seventh aspect of the present invention provides a computer comprising a memory and a processor, which are configured to store and execute program code to perform the method according to the first aspect, as described above, and/or the method according to the second aspect, as described above.

The program code according to the fifth aspect, the computer program according to the sixth aspect and the computer according to the seventh aspect each achieve the same advantages as the method according to the first aspect of the present invention.

BRIEF DESCRIPTION OF THE DRAWINGS

In the following, the invention is described exemplarily with reference to the enclosed Figures, in which FIG. 1 exemplarily shows method steps of an embodiment of the method according to the first aspect of the present invention.

DETAILED DESCRIPTION OF THE PREFERRED EMBODIMENTS

Figure 1:
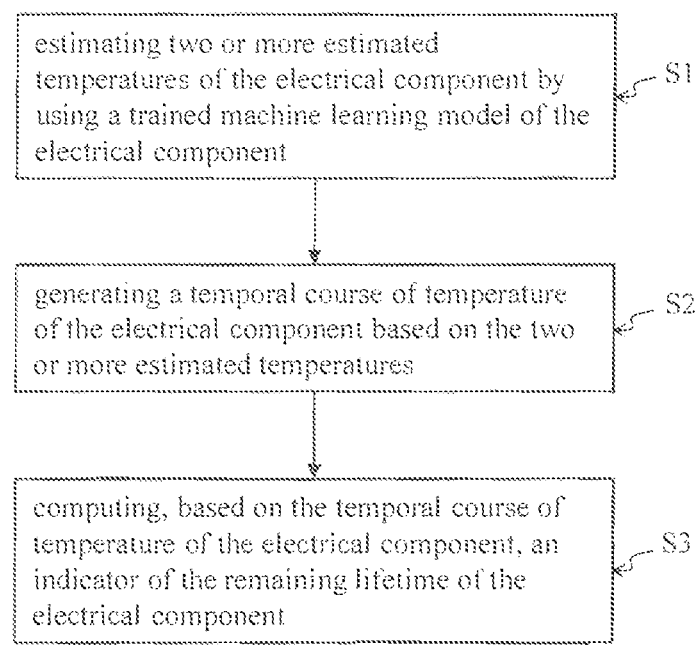
FIG. 1 exemplarily shows method steps of an embodiment of the method according to the first aspect of the present invention.

The method of FIG. 1 allows to predict a remaining lifetime of an electrical component of an electrical circuit, wherein the electrical circuit is part of a building management device. As shown in FIG. 1, in a first step S1 two or more estimated temperatures of the electrical component may be estimated using a trained machine learning model of the electrical component. For a description of how the trained machine learning model may be trained based on training data reference is made to the above description of the method according to the first aspect of the present invention. For a more detailed description of how the first step S1 is performed reference is made to the description of FIG. 2 below.

In step S2 following step S1, a temporal course of temperature of the electrical component may be generated based on the two or more estimated temperatures. In step S3 following step S2, an indicator for the remaining lifetime of the electrical component may be computed based on the temporal course of temperature of the electrical component. As outlined already above, the generation of the temporal course of the temperature and, thus, step S2 of FIG. 1 may comprise reading the two or more estimated temperature from a data storage that stores the two or more estimated temperatures and/or computing the two or more estimated temperatures in real-time. That is, the generation of the temporal course of temperature may be performed based on stored estimated temperatures and/or estimated temperatures computed by the trained machine learning model of the electrical component in real-time.

Optionally, computing, based on the temporal course of temperature of the electrical component, the indicator for the remaining lifetime of the electrical component may comprise computing the following mathematical formula:

$$RLT(t) = -\int_0^t \frac{1}{ELT(t', T, const)} dt' + 1.$$

In the above mathematical formula, RLT denotes the indicator for the remaining lifetime, ELT(t', T, const) denotes a mathematical formula for computing the lifetime of the electrical component. T denotes the temperature as an input variable of the mathematical formula. The temporal course of temperature of the electrical component is input as the temperature T and, thus, the input variable t' denotes the time. The "const" denotes that in case the mathematical formula for computing the lifetime comprises further input variables, these further input variables are assumed to be constant. The t denotes the time period over which the integration is performed and may correspond to the time period for which the temporal course of temperature of the electrical component is available.

In case the electrical component is a capacitor (e.g. an electrolytic capacitor), the method of FIG. 1 may comprise: obtaining one or more voltage ripple values of a voltage of the electrical component by obtaining for one or more time periods a respective voltage ripple value of the voltage of the electrical component; and computing, based on the one or more voltage ripple values, a further indicator for the remaining lifetime of the electrical component (not shown in FIG. 1).

The further indicator for the remaining lifetime of the electrical component may be computed by comparing the one or more voltage ripple values with one or more initial voltage ripple values, wherein an increase of the one or more voltage ripples values with regard to the one or more initial voltage ripple values indicates a decrease in the remaining lifetime of the electrical component. This is exemplarily shown in FIG. 5.

According to an embodiment, the method may comprise: obtaining two or more voltage ripple values of the voltage of the electrical component by obtaining for two or more time periods the respective voltage ripple value of the voltage of the electrical component.

Optionally, based on the two or more voltage ripple values, a temporal course of voltage ripple of the voltage of the electrical component may be generated. Based on the temporal course of voltage ripple of the voltage of the electrical component, the further indicator for the remaining lifetime of the electrical component may be computed, wherein an increase of the temporal course of voltage ripple indicates a decrease in the remaining lifetime of the electrical component.

In addition or alternatively, based on the two or more voltage ripple values, two or more capacitance values of the electrical component for the two or more time periods may be computed, wherein the greater the respective voltage ripple value the smaller the respective capacitance value of the electrical component. The voltage ripple of the voltage of the electrical component (being a capacitor) and the capacitance of the electrical component (being a capacitor) are inversely proportional to each other. Based on the two or more capacitance values, a temporal course of capacitance of the electrical component may be generated. Based on the temporal course of capacitance of the electrical component, the further indicator for the remaining lifetime of the electrical component may be computed, wherein a decrease of the temporal course of the capacitance indicates a decrease in the remaining lifetime of the electrical component. This is exemplarily shown in FIG. 5.

The further indicator for the remaining lifetime of the electrical component may be used for verifying the indicator for the remaining lifetime of the electrical component that is computed in step S3 of the method of FIG. 1.

For more information on the method of FIG. 1, in particular the steps S1, S2 and S3, reference is made to the above description of the method according to the first aspect of the present invention. That is, for more details on computing and using the indicator for the remaining lifetime of the electrical component and the optional further indicator for the remaining lifetime of the electrical component, reference is made to the above description of the method according to the first aspect of the present invention as well as to the following description of FIGS. 2 to 5.

Figure 2:
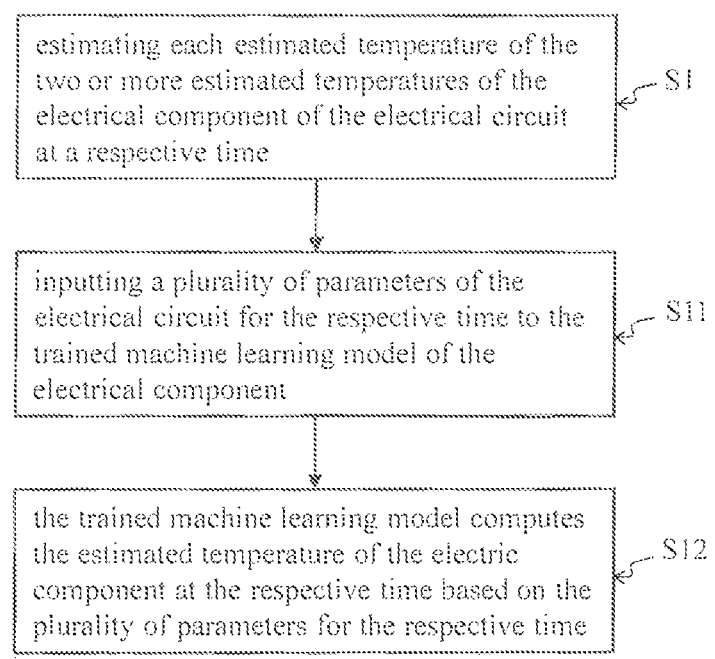
FIG. 2 exemplarily shows, according to an embodiment of the present invention, method steps for performing the method step S1 of the method of FIG. 1.

FIG. 2 exemplarily shows, according to an embodiment of the present invention, method steps for performing the method step S1 of the method of FIG. 1.

As shown in FIG. 2, the step S1 of the method of FIG. 1 may be performed by estimating each estimated temperature of the two or more estimated temperatures of the electrical component of the electrical circuit at a respective time. For estimating the estimated temperature at the respective time the steps S11 and S22 may be performed. In step S11, a plurality of parameters of the electrical circuit for the respective time is input to the trained machine learning model of the electrical component. In step S12 following step S11, the trained machine learning model computes the estimated temperature of the electrical component at the respective time based on the plurality of parameters for the respective time.

As mentioned already above, the type of the plurality of parameters for the respective time is the same as the type of the plurality of parameters that are part of the data sets of the training data used for training the machine learning model of the electrical component.

For more information on the method of FIG. 2, in particular the steps S11 and S12, reference is made to the above description of the method according to the first aspect of the present invention.

Figure 3:
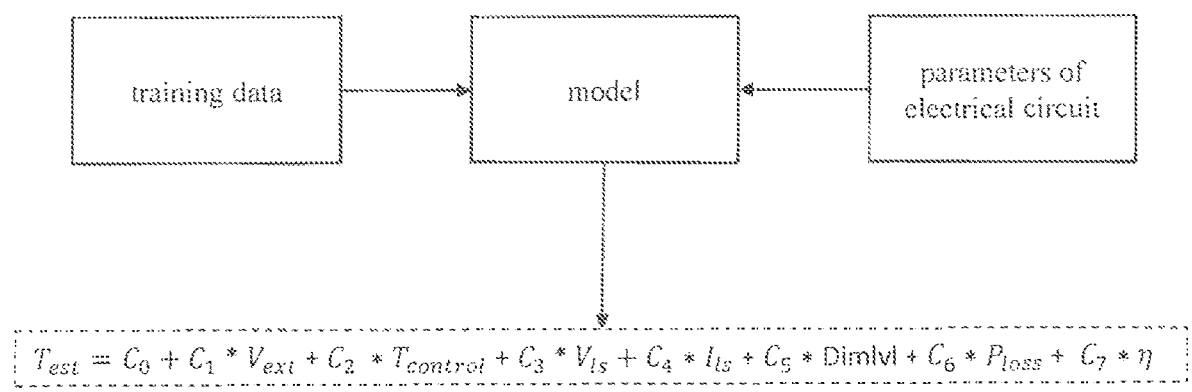
FIG. 3 exemplarily shows the use of a machine learning model of an electrical component used by an embodiment of a method according to the present invention.

FIG. 3 exemplarily shows the use of a machine learning model of an electrical component used by an embodiment of a method according to the present invention.

The box in the middle of FIG. 3 represents a machine learning model of an electrical component of an electrical circuit, wherein a remaining lifetime is to be predicted for the electrical component. As indicated by the box on the left side of FIG. 3, the machine learning model may be trained using training data. For further information on such a training reference is made to the above description of the method according to the first aspect of the present invention. As indicated by the box on the right side of FIG. 3, parameters of the electrical circuit for a certain time may be input to the trained machine learning model for estimating an estimated temperature $T_{est}$ of the electrical component at the certain time. As shown in FIG. 3, the estimated temperature $T_{est}$ may be computed by the trained machine learning model by differently weighting the parameters of the electrical circuit for the certain time, which are input to the model.

For FIG. 3, it is exemplarily assumed that the building management device comprising the electrical circuit that comprises the electrical component is a lighting device and the electrical circuit is configured to provide electrical energy to lighting means. Furthermore, it is exemplarily assumed that the parameters of the electrical circuit comprise the supply voltage $V_{ext}$ received by the electrical circuit from an electrical energy source; the temperature $T_{control}$ of a control unit controlling the electrical circuit; the load voltage $V_{ls}$ (may be referred to as lighting means voltage or light source voltage) provided by the electrical circuit to the lighting means; the load current $I_{ls}$ (may be referred to as lighting means current or light source current) provided by the electrical circuit to the lighting means; the dimming level Dimlvl; the power loss $P_{loss}$ of the electrical circuit and the energy conversion efficiency η of the electrical circuit. In this case, each of the data sets of the training data used for training the model would also comprise the supply voltage $V_{ext}$, the temperature $T_{control}$ of the control unit, the load voltage $V_{ls}$, the load current $I_{ls}$, the dimming level Dimlvl, the power loss $P_{loss}$ and the energy conversion efficiency η as the plurality of parameters of the electrical circuit in association with the respective real temperature.

The description of FIG. 3 is not limited to a lighting device and the parameters of the electrical circuit shown in FIG. 3 and, thus, is correspondingly valid for other types of building management devices and/or other combinations of two or more parameters of the electrical circuit.

As shown in FIG. 3, the different parameters of the electrical circuit may be weighted with different constants $C_1$, $C_2$, $C_3$, $C_4$, $C_5$, $C_6$ and $C_7$, which may be referred to as weighting factors, and optionally an offset $C_0$ may be applied. Thus, each of the parameters is multiplied by a weighting factor and then the weighted parameters are added-up to provide the estimated temperature $T_{est}$. Optionally, an offset $C_o$ may be added to the sum of the added weighted parameters. During the training of the machine learned model of the electrical component, the weighting factors and the optional offset may be trained, that is determined respectively adjusted, based on the plurality of data sets of the training data, wherein each data set comprises in association with the respective real temperature the parameters of the electrical circuit that are to be weighted by the trained machine learning model.

Figure 4:
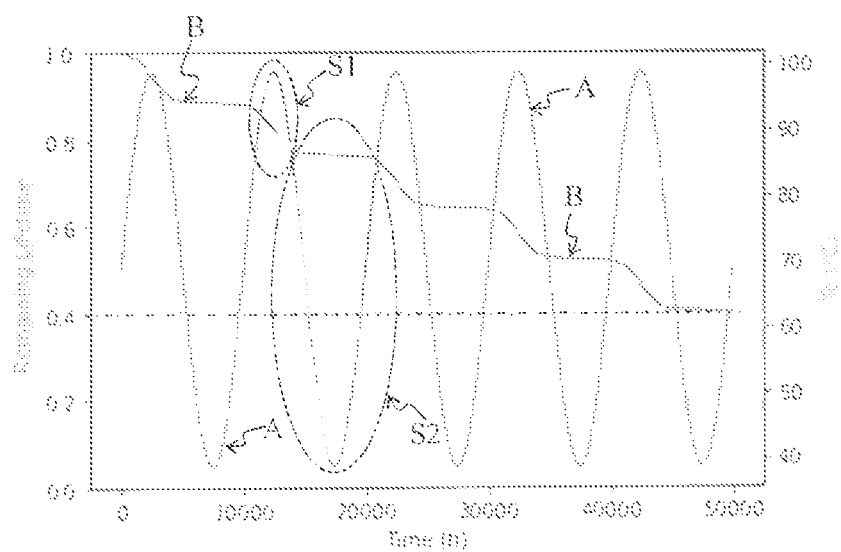
FIG. 4 exemplarily shows a relationship between the case temperature of an electrical component of an electrical circuit and the predicted remaining lifetime of the electrical component, according to an embodiment of the present invention.

FIG. 4 exemplarily shows a relationship between the case temperature of an electrical component of an electrical circuit and the predicted remaining lifetime of the electrical component, according to an embodiment of the present invention.

The curve A of the graph of FIG. 4 shows the temporal course of the case temperature of the electrical component over a time period of 50000 hours, during which the electrical circuit comprising the electrical component is operated. The curve B of the graph of FIG. 4 shows the temporal course of the remaining lifetime of the electrical component over the time period of 50000 hours. As can be seen in FIG. 4, at the beginning (0 hours) the remaining lifetime corresponds to 100% and after the 50000 hours of operating the electrical circuit the remaining lifetime of the electrical component is reduced to about 40% of the initial lifetime.

The sections S1 and S2 of the graph of FIG. 4 show that in case of high temperatures (cf. section S1), the rate of aging of the electrical component is greater compared to lower temperatures (cf. section S2). Namely, the slope of curve B at section S1 is steeper than the slope of curve B at section S2. Therefore, higher case temperatures of the electrical component (cf. section S1) more strongly reduce the remaining lifetime of the electrical component compared to lower temperatures (cf. section S2).

Figure 5:
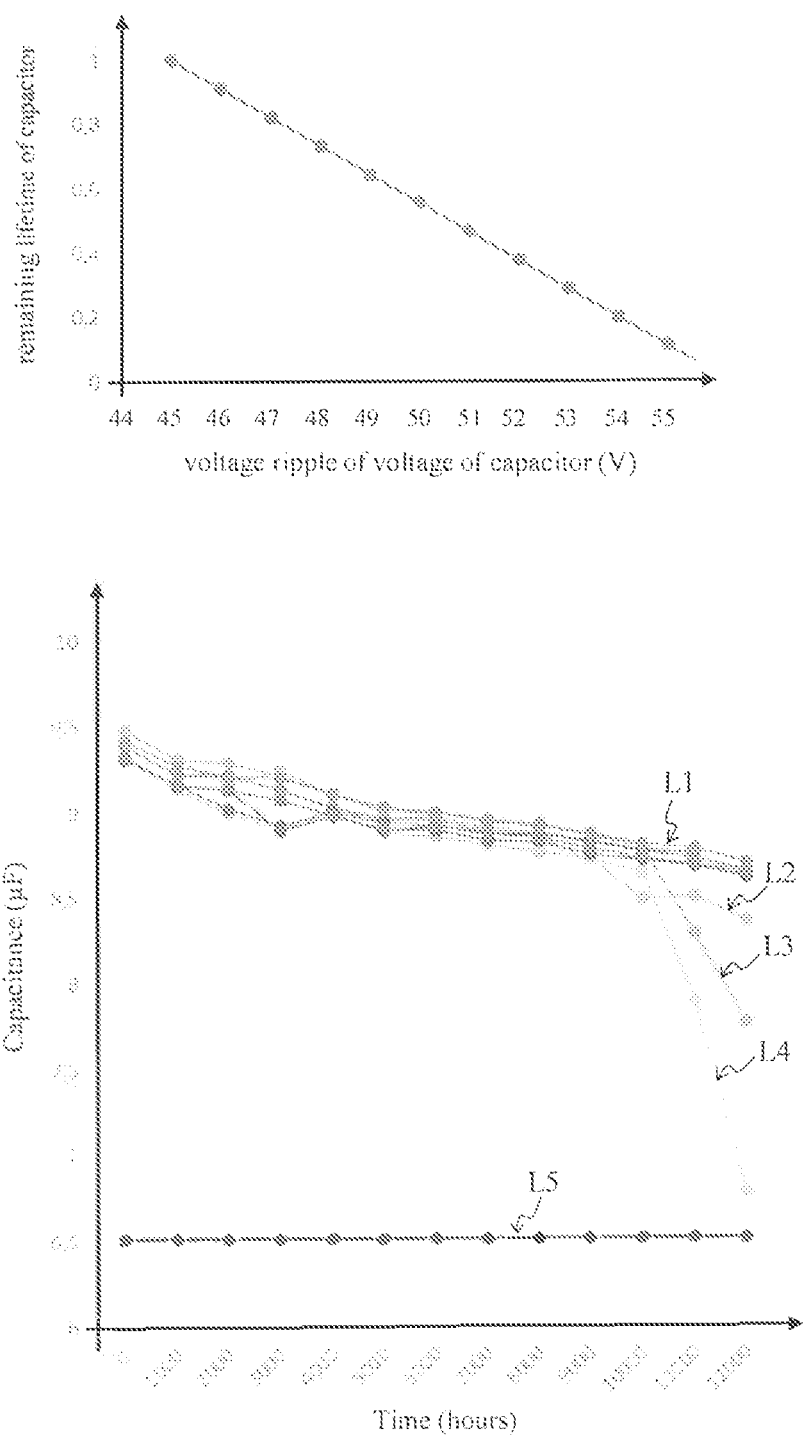
FIG. 5 exemplarily shows a relationship between the remaining lifetime of a capacitor and a voltage ripple of the voltage of the capacitor and a temporal course of the capacitance of multiple capacitors according to an embodiment of the present invention.

FIG. 5 exemplarily shows a relationship between the remaining lifetime of a capacitor and a voltage ripple of the voltage of the capacitor and a temporal course of the capacitance of multiple capacitors according to an embodiment of the present invention.

As shown in the top graph of FIG. 5, an increase of the voltage ripple of the voltage of a capacitor may indicate a decrease in the remaining lifetime of the capacitor. Namely, the voltage ripple of the voltage of the capacitor is determined by the capacitance of the capacitor, wherein the voltage ripple is inversely proportional to the capacitance of the capacitor. A decrease of capacitance of the capacitor is an indicator for aging of the capacitor and, thus, indicates a decrease of remaining lifetime of the capacitor. Therefore, an increase of the voltage ripple of the voltage of the capacitor may indicate a decrease in the remaining lifetime of the capacitor.

As can be seen in the top graph of FIG. 5, when the remaining lifetime of the capacitor corresponds to 100% of the initial lifetime of the capacitor the voltage ripple of the voltage of the capacitor corresponds to 45 V (Volts). The initial lifetime may be obtained from the data sheet of the capacitor. As the voltage ripple increases, the remaining lifetime of the capacitor decreases so that when the voltage ripple equals to 54 V the remaining lifetime is decreased to 20% of the initial lifetime.

The bottom graph of FIG. 5 exemplarily shows a temporal course of the capacitance (in μF) for multiple capacitors. Each line of the lines L1, L2, L3 and L4 shows a temporal course of capacitance of a capacitor. As can be seen at the beginning of operating the capacitors, that is between 0 hours and 9000 hours of operation, the decrease of the capacitance of the capacitors over time is similar. The decrease of the temporal course of capacitance indicated by lines L1, L2, L3 and L4 may indicate a decrease of the remaining lifetime of the respective capacitor. That is the decrease of capacitance over time indicated by lines L1, L2, L3 and L4 may indicate a decrease of the remaining lifetime of the respective capacitor.

After 9000 hours of operation, among the capacitors of lines L1, L2, L3 and L4, only the capacitance of the capacitor indicated by line L1 continues to decrease by roughly the same reduction rate. The capacitance of the capacitor indicated by line L2 decreases after the 9000 hours of operation by a greater reduction rate compared to the reduction rate before. The capacitance of the two capacitors indicated by the lines L3 and L4 decreases after 10000 hours of operation by a critical reduction rate. The change of the capacitance over time, indicated by lines L3 and L4, may indicate a malfunction or failure of the respective capacitor. Therefore, in case of detecting such sudden high reduction rates, as shown by lines L3 and L4 after 10000 hours of operation, an alarm indicating a reduced remaining lifetime of the respective capacitor may be output.

For this, a threshold for the change of the temporal course of capacitance within a time period may be set. For assessing the change over time respectively the reduction rate of the lines L1, L2, L3 and L4, the time period is assumed to be for example 500 hours of operation. In the bottom graph of FIG. 5, for the 12000 hours of operation, the change of the temporal course of capacitance, shown by lines L1 and L2, within a time period of 500 hours, is smaller than or equal to such a threshold. After 10000 hours of operation, the change of the temporal course of capacitance, shown by lines L3 and L4, within a time period of 500 hours is greater than such a threshold.

The line L5 indicates 20% of the nominal capacitance of the capacitors. It may be considered that when the capacitance of a capacitor reaches 20% of the nominal capacitance of the capacitor, then the capacitor reaches its "end-of-life", that is the remaining lifetime of the capacitor is critical.

As outlined above, and shown by lines L3 and L4 of the bottom graph of FIG. 5, a fast drop (decrease) of capacitance of a capacitor over time may act as an indicator for a capacitor failure in the near future. That is, this may act as an indicator for a critical remaining lifetime of the capacitor. A slowly decreasing temporal course of capacitance of a capacitor, as exemplarily shown by line L1, may be extrapolated, e.g. towards 20% of the nominal capacitance of the capacitor, for determining a further indicator for the remaining lifetime of the capacitor.

Figure 6:
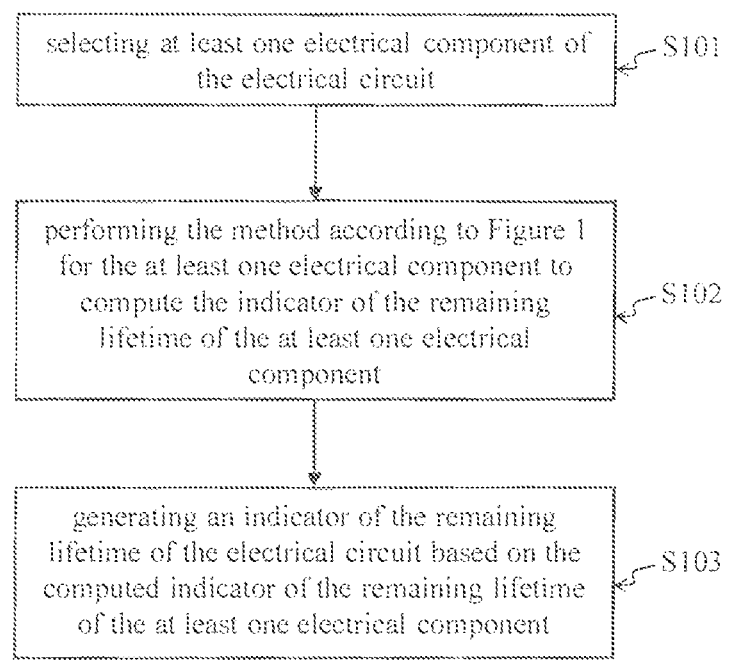
FIG. 6 exemplarily shows method steps of an embodiment of the method according to the second aspect of the present invention.

FIG. 6 exemplarily shows method steps of an embodiment of the method according to the second aspect of the present invention.

The method of FIG. 6 allows to predict a remaining lifetime of an electrical circuit, wherein the electrical circuit is part of a building management device. As shown in FIG. 6, in a first step S101 at least one electrical component of the electrical circuit may be selected. In step S102 following step S101, the method according to FIG. 1, i.e. the method steps S1, S2 and S3 of FIG. 1, may be performed for the at least one electrical component to compute the indicator for the remaining lifetime of the at least one electrical component.

In step S103 following step S102, an indicator for the remaining lifetime of the electrical circuit may be computed based on the computed indicator for the remaining lifetime of the at least one electrical component. As outlined already above, in case one electrical component of the electrical circuit is selected, the indicator for the remaining lifetime of the electrical circuit may be equal to the computed indicator for the remaining lifetime of the electrical component. In case two or more electrical components of the electrical circuit are selected in step S101, the step S102 is repeated for each electrical component of the two or more electrical components. That is, in step S102, the method according to FIG. 1, i.e. the method steps S1, S2 and S3 of FIG. 1, is performed for each electrical component of the two or more electrical components to compute the respective indicator for the remaining lifetime of the electrical component. Further, in step S103, generating the indicator for the remaining lifetime of the electrical circuit may comprise or correspond to: selecting the respective indicator (i.e. indicator computed in step S102) indicating the shortest remaining lifetime as the indicator for the remaining lifetime of the electrical circuit. That is, the indicator indicating the shortest remaining lifetime is selected among the indicators, computed for the two or more electrical components in step S102, as the indicator for the remaining lifetime of the electrical circuit. In other words, in step S102, for the two or more electrical components two or more indicators of the remaining lifetime of the respective electrical component are computed and, in step S103, among the two or more indicators of the remaining lifetime of the respective electrical component the indicator indicating the shortest (smallest) remaining lifetime is selected as the indicator for the remaining lifetime of the electrical circuit.

In case the at least one electrical component (selected in S101) of the electrical circuit is a capacitor, one or more voltage ripple values of a voltage of the at least one electrical component may be obtained by obtaining for one or more time periods a respective voltage ripple value of the voltage of the electrical component; a further indicator for the remaining lifetime of the at least one electrical component may be computed based on the one or more voltage ripple values; and a further indicator for the remaining lifetime of the electrical circuit may be generated based on the computed further indicator for the remaining lifetime of the at least one electrical component.

In case one electrical component of the electrical circuit is selected in step S101, the further indicator for the remaining lifetime of the electrical circuit is equal to the computed further indicator for the remaining lifetime of the electrical component.

In case two or more electrical components (being two or more capacitors) of the electrical circuit are selected in step S101, the method may comprise: performing the aforementioned steps for computing the further indicator for the remaining lifetime of the at least one electrical component, for each electrical component of the two or more electrical components to compute the respective further indicator for the remaining lifetime of the electrical component; and selecting the respective further indicator indicating the shortest remaining lifetime as the further indicator for the remaining lifetime of the electrical circuit.

For more information on the method of FIG. 6, in particular the steps S101, S102 and S103, reference is made to the above description of the method according to the first aspect of the present invention and the above description of the method according to the second aspect of the present invention. In addition, reference is made to the above description of FIG. 1. That is, for more details on computing and using the indicator for the remaining lifetime of the electrical circuit and the optional further indicator for the remaining lifetime of the electrical circuit, reference is made to the above description of the method according to the first aspect of the present invention and the above description of the method according to the second aspect of the present invention.

Figure 7:
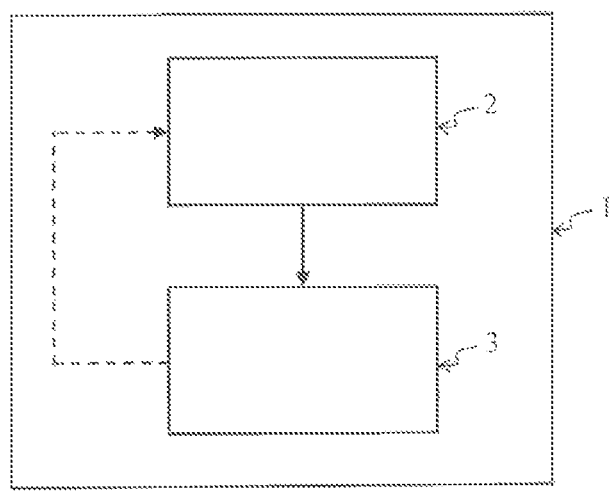
FIG. 7 exemplarily shows a block diagram of an embodiment of the building management device according to the fourth aspect of the present invention.

FIG. 7 exemplarily shows a block diagram of an embodiment of the building management device according to the fourth aspect of the present invention.

According to FIG. 7 a building management device 1 may comprise an electrical circuit 3 and a control unit 2 configured to control operation of the electrical circuit 3 (as indicated by the arrow from block 2 to block 3). The control circuit 2 may be configured to perform the method of FIG. 1 for predicting a remaining lifetime of an electrical component of the electrical circuit 3. In addition or alternatively, the control unit 2 may be configured to perform the method of FIG. 6 for predicting a remaining lifetime of the electrical circuit 3. The dashed arrow from block 3 to block 2 indicates that parameters of the electrical circuit 3 may be provided from the electrical circuit 3 to the control unit 2 for performing the method of FIG. 1 and/or the method of FIG. 6.

The control unit 2 uses a trained machine learning model of the electrical component for predicting the remaining lifetime of the electrical component. The control unit 2 uses a trained machine learning model of at least one electrical component of the electrical circuit 3 for predicting the remaining lifetime of the electrical circuit 3. For more information on these predictions and the trained machine learning models, reference is made to the above description of the method according to the first aspect of the present invention and the method according to the second aspect of the present invention.

The control unit 2 is an embodiment of the control unit according to the third aspect of the present invention. The above description of the control unit of the third aspect of the present invention is valid for describing the control unit 2 of FIG. 7. The building management device 1 is an embodiment of the building management device according to the fourth aspect of the present invention. The above description of the building management device according to the fourth aspect of the present invention is valid for describing the building management device 1 of FIG. 7.

Figure 8:
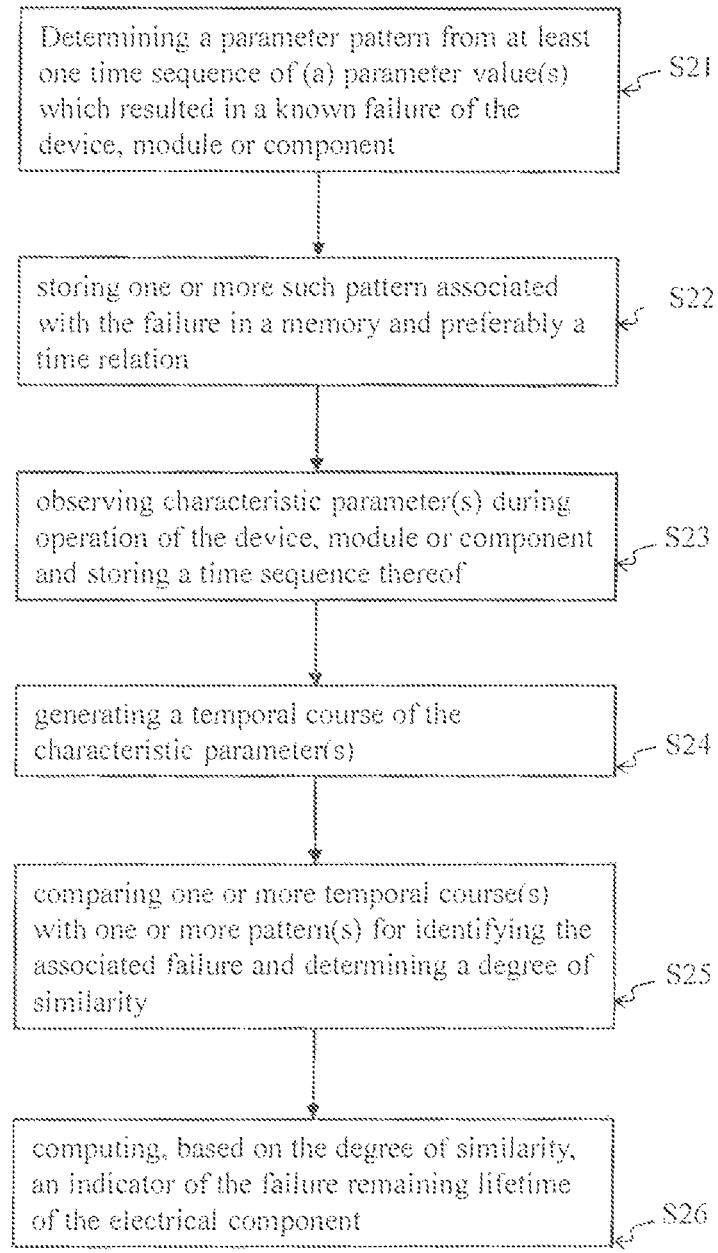
FIG. 8 exemplarily shows method steps of an embodiment of the method when the characteristic parameter can be directly observed.

The above presented explanations concerned the case where the characteristic parameter is not directly observable, and in order to generate a temporal course of the parameter, a model is generated for estimating the characteristic parameter. However, it is also possible to directly analyse observe various parameters that allow identifying situations that are typical for a future failure of the electronic component, an electrical circuit comprising this component or a module or even an entire device. Turning now to FIG. 8, exemplary method steps for such a situation are explained.

First, a device comprising at least one module and/or an electrical circuit comprising an electrical component is analyzed with respect to accidentally occurring failures. This might be done in a dedicated test environment where the device undergoes a lifetime test being a shortened period of time in which the entire lifetime of the device can be simulated. One or a plurality of parameters of the device can be observed and, thus a sequence of values of these parameters is stored. When a failure in the device occurs, the failure is identified and the sequence of values of the parameters until the failure occurred are analyzed in order to determine a pattern for the parameters which is typical to preced the recognised failure.

It is to be noted that in the above described example only a situation with the lifetime testing is mentioned but it is also possible to analyse devices being sent back from a customer in case that the parameters that are measured during operation of the device have been logged and are provided to the manufacturer for determining the pattern of the sequence parameter values before the device failed. Alternatively, it is also possible to provoke a failure, for example, using an NTC or PTC instead of a constant value resistor. In that case the time needed for analysing the measured parameter values is significantly reduced as the failure can be precisely predicted in the test environment.

Using one of the above mentioned procedures allows to determine a parameter pattern for a single time sequence of a single time sequence of parameter values, or even a plurality of time sequences. From the analysis of the correlation of occurrence of the failure and the time sequence of the values of the parameters, it is possible to isolate a typical temporal course of a parameter before a failure occurs. The corresponding typical sequence of values can then be determined as a parameter pattern which allows to conclude that a certain failure will soon occur when a similar parameter pattern can be recognized in an actual sequence of measure parameter values. The pattern is determined in step S21. Once such pattern, or a plurality of different patterns indicating different failures are identified, the patterns are stored in a memory that may be included directly in the device or in an external memory. In any case, the memory must be connected to the control circuit in order to allow an analysis which will be explained in greater detail below. The pattern for the plurality of patterns is stored in the memory in step S22. When the pattern is stored, the respective failure which corresponds to the particular pattern is stored associated with the pattern. If only the failure is stored in combination with the pattern, it is only possible to predict that such failure occurs but it is not possible to indicate a time when the failure occurs. If the time to failure shall also be predicted, the analysis in step S21 must also analyse the time relationship between an identified pattern and the failure of the device. Such time relationship may also be stored in association with the pattern in step S22.

The determination of the pattern(s) and storing the pattern and its associated information in the memory is performed in advance. So a device which is sold to a customer already comprises information or may be connected to a memory which holds the information concerning the patterns, the failure and advantageously also the time relation.

During operation, the parameters are observed and the measured values of the parameters are logged for later analysis. This is done in step S23. From logging the values of the parameters that are measured during operation, the time sequence of the parameter is available. From the stored values, it is thus possible to generate a temporal course of the characteristic parameters as indicated in FIG. 8 as step S24. This step corresponds to above explained temporal course of the estimated temperature with the difference that according to the now explained embodiment, the characteristic parameter(s) may be directly measured during operation and does not require establishing a model in order to estimate the parameter.

In step S25 the temporal course of the parameter is compared with the stored pattern which is retrieved from the memory in order to conduct the comparison. From the comparison, a degree of similarity between the temporal because of the characteristic parameter and the stored pattern is determined. In case that the similarity exceeds a certain threshold, it is assumed that the stored temporal course of the values that are observed during operation of the device indicates the same situation, which corresponds to the pattern which are stored in the memory. Thus, if the degree of similarity exceeds the threshold, it can be concluded that the situation experienced by the device corresponds to the situation that led to the failure in the test environment. Thus, the failure stored associated with this pattern will occur in the future. In case that not only the failure but also a time relationship restored associated with the pattern, it is even possible to predict the remaining lifetime or, to be more general, a certain point in time in the future when the identified failure will occur.

Finally, based on the degree of similarity, the indicator of the remaining lifetime or the failure which will happen in the future can be computed.

It is to be noted that despite the generation of the temporal course of the characteristic parameter and the determination which failure is to be expected, all other aspects that already had been explained with reference to FIGS. 1 to 7 are valid also for the present embodiment. Further, it is possible that the pattern comprises a plurality of different parameters, wherein for each of these parameters a temporal course is generated and the entirety of generated temporal courses of parameters is compared with the respective information included in a single pattern. So in order to predict a future failure all the values of parameters that can be measured or otherwise identified in the device, will be used to generate a respective temporal course for the parameter. The temporal course may therefore be individually compared to a corresponding pattern stored in the memory and even a plurality of different parameters in combination can be compared to the respective parameter concerning the same plurality of parameters.

It is evident, that it is also possible that the measured values of the parameters are transmitted to a different computing entity and that the analysis is conducted in this separate entity. The parameters, or rather the measured values of the parameters, can be forwarded by using a DALI bus system, for example.

The invention claimed is:

1. A method for predicting failure or a remaining lifetime of a building management device or an electrical component of an electrical circuit, the electrical circuit being part of the building management device, wherein the method comprises:
   observing or estimating at least one characteristic parameter of the building management device or the electrical component;
   generating (S2) a temporal course of the characteristic parameter(s) based on the observed or estimated characteristic parameter(s); and
   computing (S3), based on the temporal course of the characteristic parameter(s), an indicator for the failure or the remaining lifetime of the building management device or the electrical component;
   wherein computing the indicator for the failure or the remaining lifetime comprises determining a degree of similarity between the temporal course of the characteristic parameter(s) with a pattern of the respective characteristic parameter(s) retrieved from a memory, wherein the pattern stored is associated with a failure to be expected and the characteristic parameter(s) is/are observed parameter(s).

2. The method according to claim 1, wherein
   the estimated characteristic parameter is a temperature of the building management device or the electrical component and the method comprises:
   estimating (S1) two or more estimated temperatures of the building management device or the electrical component by using a trained machine learning model of the building management device or the electrical component that is trained based on training data comprising a plurality of data sets, wherein each data set of the plurality of data sets comprises:
      a real temperature of the building management device, the module, or electrical component at a respective time of an operation of the building management device, or the electrical circuit, in association with
      a plurality of parameters of the building management device, the module or the electrical circuit at the respective time, wherein the plurality of parameters comprises one or more physical parameters of the building management device or the electrical circuit and/or one or more operation parameters of the building management device or the electrical circuit;
   estimating (S1) each estimated temperature of the two or more estimated temperatures at a respective time by inputting (S11) the plurality of parameters for the respective time to the trained machine learning model that computes (S12) the estimated temperature of the electrical component at the respective time based on the plurality of parameters for the respective time.

3. The method according to claim 2, wherein the machine learning model corresponds to:
a regression model, or
a neural network model, comprising a deep neural network model.

4. The method according to claim 1, wherein the machine learning model comprises at least one algorithm differently weighting the plurality of parameters to compute, as an output, the estimated temperature at the respective time, wherein the weighting is determined by the training of the machine learning model based on the training data.

5. The method according to claim 1, wherein computing the indicator for the failure or the remaining lifetime comprises integrating the temporal course of temperature.

6. The method according to claim 5, wherein computing the indicator for the failure or the remaining lifetime further comprises weighting the integrated temporal course of temperature with a weighting function or weighting factor, wherein the weighting function or the weighting factor is dependent on at least one parameter of the plurality of parameters.

7. The method according to claim 1, wherein information of a time relation of the pattern and the failure is stored associated with the pattern.

8. The method according to claim 7, wherein the method comprises:
computing the further indicator for the failure or the remaining lifetime of the electrical component by comparing the one or more voltage ripple values with one or more initial voltage ripple values, wherein an increase of the one or more voltage ripples values with regard to the one or more initial voltage ripple values indicates a decrease in the remaining lifetime of the electrical component.

9. The method according to claim 8, wherein the method comprises:
monitoring the temporal course of voltage ripple of the voltage of the electrical component, and
in case a change of the temporal course of voltage ripple within a time period is greater than a threshold for the change:
outputting an alarm indicating a reduced remaining lifetime of the electrical component; and/or
automatically adjusting at least one setting of the building management device; and/or
the method comprises:
monitoring the temporal course of capacitance of the electrical component, and
in case a change of the temporal course of capacitance of the electrical component within a time period is greater than a threshold for the change:
outputting an alarm indicating a reduced remaining lifetime of the electrical component; and/or
automatically adjusting at least one setting of the building management device.

10. The method according to claim 1, wherein the temporal course of the characteristic parameter(s) is determined to correspond to a specific pattern, if the degree of similarity exceeds a predefined threshold.

11. The method according to claim 1, wherein the pattern(s) are determined from observation of the characteristic parameter(s) until a failure occurs in a test environment or from an analysis of the failure and stored observed data on the characteristic parameter(s).

12. The method according to claim 1, wherein the parameter(s) is/are selected from a group of parameters comprising:
a temperature of a control unit for controlling the electrical circuit;
a temperature of a substrate, comprising a printed circuit board, at which the electrical circuit is arranged;
a temperature inside a housing of the building management device;
a supply voltage received by the electrical circuit from an electrical energy source;
a supply current received by the electrical circuit from the electrical energy source;
frequency of the supply voltage and/or current received by the electrical circuit from the electrical energy source,
an output voltage output by the electrical circuit;
an output current output by the electrical circuit;
a power loss of the electrical circuit;
an energy conversion efficiency of the electrical circuit;
a value for setting an operation state of the building management device, and
in case the building management device is a lighting device, a dimming level at which the electrical circuit is operated for electrically supplying lighting means.

13. The method according to claim 1, wherein the electrical component is a capacitor, the method further comprising:
obtaining one or more voltage ripple values of a voltage of the electrical component by obtaining for one or more time periods a respective voltage ripple value of the voltage of the electrical component; and
computing, based on the one or more voltage ripple values, a further indicator for the failure or the remaining lifetime of the electrical component.

14. The method according to claim 13, wherein the method comprises:
obtaining two or more voltage ripple values of the voltage of the electrical component by obtaining for two or more time periods the respective voltage ripple value of the voltage of the electrical component,
generating, based on the two or more voltage ripple values, a temporal course of voltage ripple of the voltage of the electrical component, and
computing, based on the temporal course of voltage ripple of the voltage of the electrical component, the further indicator for the failure or the remaining lifetime of the electrical component, wherein an increase of the temporal course of voltage ripple indicates a decrease in the remaining lifetime of the electrical component; and/or
the method comprises:
obtaining two or more voltage ripple values of the voltage of the electrical component by obtaining for two or more time periods the respective voltage ripple value of the voltage of the electrical component,
computing, based on the two or more voltage ripple values, two or more capacitance values of the electrical component for the two or more time periods, wherein the greater the respective voltage ripple value the smaller the respective capacitance value of the electrical component,
generating, based on the two or more capacitance values, a temporal course of capacitance of the electrical component, and
computing, based on the temporal course of capacitance of the electrical component, the further indicator for the failure or the remaining lifetime of the electrical component, wherein a decrease of the temporal course of the capacitance indicates a decrease in the remaining lifetime of the electrical component.

15. The method according to claim 13, wherein the method comprises verifying the computed indicator for the remaining lifetime of the electrical component based on the computed further indicator for the remaining lifetime of the electrical component; and the method further comprising:
   replacing the computed indicator for the remaining lifetime of the electrical component with the computed further indicator for the remaining lifetime of the electrical component, in case the computed further indicator for the remaining lifetime of the electrical component indicates a shorter remaining lifetime compared to the computed indicator for the remaining lifetime of the electrical component,
   re-computing the indicator for the remaining lifetime of the electrical component, in case the difference between the computed indicator and the computed further indicator is greater than a threshold for the difference, and/or
   correcting the computed indicator for the remaining lifetime of the electrical component based on the computed further indicator for the remaining lifetime of the electrical component, in case the difference between the computed indicator and the computed further indicator is greater than a threshold for the difference.

16. The method according to claim 1, wherein the method comprises comparing the computed indicator for the remaining lifetime and/or the computed further indicator for the remaining lifetime of the electrical component with a threshold for the remaining lifetime of the electrical component, and
   in case the remaining lifetime of the indicator and/or the further indicator is equal to or smaller than the threshold, or when the degree of similarity exceeds the predetermined threshold:
      outputting an alarm indicating a failure or reduced remaining lifetime of the electrical component; and/or
      automatically adjusting at least one setting of the building management device.

* * * * *